US012696644B2

(12) United States Patent
Liu

(10) Patent No.: US 12,696,644 B2
(45) Date of Patent: Jul. 28, 2026

(54) DISPLAY SUBSTRATE, MANUFACTURING METHOD, AND DISPLAY DEVICE

(71) Applicant: BOE TECHNOLOGY GROUP CO., LTD., Beijing (CN)

(72) Inventor: Hao Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 406 days.

(21) Appl. No.: 18/576,484

(22) PCT Filed: Mar. 31, 2023

(86) PCT No.: PCT/CN2023/085622
§ 371 (c)(1),
(2) Date: Jan. 4, 2024

(87) PCT Pub. No.: WO2024/197864
PCT Pub. Date: Oct. 3, 2024

(65) Prior Publication Data
US 2025/0098453 A1      Mar. 20, 2025

(51) Int. Cl.
*H10K 59/131*       (2023.01)
*H10K 59/12*        (2023.01)
*H10K 59/122*       (2023.01)
*H10K 59/124*       (2023.01)

(52) U.S. Cl.
CPC ....... *H10K 59/131* (2023.02); *H10K 59/1201* (2023.02); *H10K 59/122* (2023.02); *H10K 59/124* (2023.02)

(58) Field of Classification Search
CPC ............. H10K 59/131; H10K 59/1201; H10K 59/122; H10K 59/124
See application file for complete search history.

(56) References Cited

U.S. PATENT DOCUMENTS

| | | |
|---|---|---|
| 2016/0035284 A1 | 2/2016 | Jung et al. |
| 2020/0027936 A1* | 1/2020 | Wang .................. H10K 59/122 |
| 2022/0199737 A1 | 6/2022 | Wang et al. |

FOREIGN PATENT DOCUMENTS

| | | |
|---|---|---|
| CN | 105321474 A | 2/2016 |
| CN | 107748470 A | 3/2018 |
| CN | 210429135 U | 4/2020 |
| KR | 20180071051 A | 6/2018 |
| WO | 2021/253343 A1 | 12/2021 |

\* cited by examiner

*Primary Examiner* — Samuel A Gebremariam
(74) *Attorney, Agent, or Firm* — WHDA, LLP

(57) ABSTRACT

The present disclosure provides a display substrate, a manufacturing method and a display device. The display substrate includes a first screen and a second screen, and outer contours of the first screen and the second screen cooperate with each other to define an recess. The display substrate includes: a back plate including a first signal line arranged in a peripheral region of the first screen and the second screen; and a light-emitting element including a first electrode, a light-emitting functional layer and a second electrode laminated one on another. A partition structure is provided along an edge of the recess in the peripheral region of the first screen and the second screen, the light-emitting functional layer is interrupted by the partition structure to form an opening, and the first electrode covers the partition structure in a shape-following manner and is lapped onto the first signal line via the opening.

20 Claims, 11 Drawing Sheets

DISPLAY SUBSTRATE, MANUFACTURING METHOD, AND DISPLAY DEVICE

CROSS-REFERENCE TO RELATED APPLICATION

This application is the U.S. national phase of PCT Application No. PCT/CN2023/085622 filed on Mar. 31, 2023, which is incorporated herein by reference in its entirety.

TECHNICAL FIELD

The present disclosure relates to the field of display technology, in particular to a display substrate, a manufacturing method thereof, and a display device.

BACKGROUND

With the development of the display technology, the diversity of full-screen or double-screen display devices is highly demanded. However, due to the limit of a process, such problems as brightness non-uniformity occurs when a display substrate is deformed.

SUMMARY

An object the present disclosure is to provide a display substrate, a manufacturing method thereof, and a display device, so as to improve the quality of a display product.

The technical solutions in the embodiments of the present disclosure will be described as follows.

In one aspect, the present disclosure provides in some embodiments a display substrate including a first screen and a second screen, an outer contour of the first screen cooperating with an outer contour of the second screen to define at least one recess in the display substrate. The display substrate includes: a back plate including a first signal line, the first signal line being configured to provide a common power supply voltage signal and arranged in a peripheral region of the first screen and the second screen; and light-emitting elements arranged in the first screen and the second screen, the light-emitting element including a first electrode, a light-emitting functional layer and a second electrode laminated one on another from a side away from the back plate to a side close to the back plate. A partition structure is arranged along an edge of the recess in the peripheral region of the first screen and the second screen, the partition structure is located at a side of the light-emitting functional layer close to the back plate, orthogonal projections of the light-emitting functional layer and the first electrode onto the back plate at least partially overlap with an orthogonal projection of the partition structure onto the back plate, the light-emitting functional layer is interrupted by the partition structure to form an opening, and the first electrode covers the partition structure in a shape-following manner and is lapped onto the first signal line via the opening.

In a possible embodiment of the present disclosure, the second electrode corresponds to at least one pixel, and the first electrode corresponds to at least one second electrode.

In a possible embodiment of the present disclosure, the first electrode is a cathode and the second electrode is an anode.

In a possible embodiment of the present disclosure, in the peripheral region of the first screen and the second screen other than a region corresponding to the recess, the orthogonal projection of the light-emitting functional layer onto the back plate does not coincide with an orthogonal projection of the first signal line onto the back plate, the orthogonal projection of the first electrode onto the back plate coincides with the orthogonal projection of the first signal line onto the back plate, and the first electrode is lapped onto the first signal line.

In a possible embodiment of the present disclosure, the first electrode is lapped onto the first signal line through an adapter pattern, and the adapter pattern is arranged at a same layer, and made of a same material, as the first electrode; or the first electrode is directly lapped onto the first signal line.

In a possible embodiment of the present disclosure, the display substrate further includes a planarization layer arranged between the first signal line and the light-emitting element, the partition structure includes a partition gasket extending along an edge of the recess and arranged on a side surface of the planarization layer away from the back plate, a cross section of the partition gasket in a direction perpendicular to the back plate is an inverted trapezoid with a long upper base and a short lower base, the lower base is arranged close to the back plate is, and the upper base is arranged away from the back plate.

In a possible embodiment of the present disclosure, an orthogonal projection of the adapter pattern onto the back plate at least partially overlaps with the orthogonal projection of the first signal line onto the back plate, and the adapter pattern is lapped onto the first signal line through a via hole in the planarization layer. An orthogonal projection of the partition gasket onto the back plate partially overlaps with the orthogonal projection of the adapter pattern onto the back plate, the light-emitting functional layer covers a side of the adapter pattern and the partition gasket away from the back plate, and there is a segment difference between the partition gasket and the adapter pattern in the direction perpendicular to the back plate, so that the light-emitting functional layer is interrupted to form the opening and a part of the adapter pattern is exposed. The first electrode covers the light-emitting functional layer, the exposed part of the adapter pattern and the partition gasket in a shape-following manner such that the first electrode is lapped onto the adapter pattern.

In a possible embodiment of the present disclosure, the partition gasket is made of a negative photoresist.

In a possible embodiment of the present disclosure, the display substrate further includes a planarization layer arranged between the first signal line and the light-emitting element, the partition structure includes a groove formed in a side surface of the planarization layer away from the back plate and extending along an edge of the recess, a cross section of the groove in the direction perpendicular to the back plate is a trapezoid with a short upper base and a long lower base, the lower base is arranged close to the back plate, and the upper base is arranged away from the back plate.

In a possible embodiment of the present disclosure, an orthogonal projection of the adapter pattern onto the back plate at least partially overlaps with the orthogonal projection of the first signal line onto the back plate, and the adapter pattern is lapped onto the first signal line through a via hole in the planarization layer. An orthogonal projection of the groove onto the back plate partially overlaps with the orthogonal projection of the adapter pattern onto the back plate, the light-emitting functional layer covers a side of the adapter pattern away from the back plate and a bottom of the groove close to the back plate, and there is a segment difference between the groove and the adapter pattern in the direction perpendicular to the back plate, so that the light-emitting functional layer is interrupted to form the opening and a part of the adapter pattern is exposed. The first electrode covers the light-emitting functional layer, the exposed part of the adapter pattern and the groove in a shape-following manner such that the first electrode is lapped onto the adapter pattern.

In a possible embodiment of the present disclosure, the first signal line includes a first film layer, a second film layer and a third film layer stacked in sequence in a direction away from the back plate, a width of the second film layer in a direction perpendicular to an extending direction of the first signal line is less than a width of each of the first film layer and the third film layer in the direction perpendicular to the extending direction of the first signal line so that the first signal line is provided with a lateral groove at a position corresponding to the second film layer, and the first signal line with the lateral groove forms the partition structure.

In a possible embodiment of the present disclosure, the planarization layer is provided with an opening pattern, an orthogonal projection of the opening pattern onto the back plate coincides with an orthogonal projection of the first signal line with the lateral groove onto the back plate, the light-emitting functional layer is interrupted by the first signal line with the lateral groove to form the opening so that the first signal line is exposed, and the second electrode covers the first signal line in a shape-following manner so as to be directly lapped onto the first signal line.

In a possible embodiment of the present disclosure, the back plate includes a thin film transistor, the thin film transistor includes a source electrode, a drain electrode and a gate electrode, and the first signal line is arranged at a same layer, and made of a same material, as the source electrode and the drain electrode.

In a possible embodiment of the present disclosure, the first screen is a circular primary screen, the second screen is a stretchable semi-annular secondary screen, an inner diameter of the secondary screen is greater than an inner diameter of the primary screen, a center of the secondary screen coincides with a center of the primary screen, a first inner tangent point of the secondary screen is connected to a second outer tangent point of the primary screen, and the recess is defined by an outside contour of the primary screen and an inside contour of the secondary screen.

In another aspect, the present disclosure provides in some embodiments a display device including the above-mentioned display substrate.

In a possible embodiment of the present disclosure, the secondary screen further includes a first end and a second end opposite to each other in a circumferential direction, and when the secondary screen is in a stretched state, the first end abuts against the second end so that the secondary screen surrounds the primary screen.

In yet another aspect, the present disclosure provides in some embodiments a method for manufacturing the above-mentioned display substrate, including: forming a back plate, the back plate including a first signal line for providing a common power supply voltage signal, the first signal line being arranged in a peripheral region of the first screen and the second screen; and forming light-emitting elements and a partition structure on the back plate, the light-emitting elements being formed in the first screen and the second screen. The light-emitting element includes a first electrode, a light-emitting functional layer and a second electrode laminated one on another from a side away from the back plate to a side close to the back plate, the partition structure is arranged along an edge of the recess in the peripheral region of the first screen and the second screen, the partition structure is located at a side of the light-emitting functional layer close to the back plate, orthogonal projections of the light-emitting functional layer and the first electrode onto the back plate at least partially overlaps with an orthogonal projection of the partition structure onto the back plate, the light-emitting functional layer is interrupted by the partition structure to form an opening, and the first electrode covers the partition structure in a shape-following manner and is lapped onto the first signal line via the opening.

In a possible embodiment of the present disclosure, the forming the light-emitting elements and the partition structure on the back plate specifically includes: forming a planarization layer at a side of the first signal line away from a base substrate of the back plate, and patterning the planarization layer to form the via hole; forming an adapter pattern and a second electrode on the planarization layer, an orthogonal projection of the adapter pattern onto the back plate at least partially overlapping with an orthogonal projection of the first signal line onto the back plate, the adapter pattern being lapped onto the first signal line through the via hole in the planarization layer; forming a partition gasket on a side surface of the planarization layer and the adapter pattern away from the back plate, an orthogonal projection of the partition gasket onto the back plate partially overlapping with the orthogonal projection of the adapter pattern onto the back plate, a segment difference being provided between the partition gasket and the adapter pattern in a direction perpendicular to the back plate; forming a light-emitting functional layer on a side surface of the planarization layer and the partition gasket away from the back plate, the light-emitting functional layer being interrupted between the partition gasket and the adapter pattern to form an opening so that a part of the adapter pattern is exposed; and forming the first electrode on the light-emitting functional layer, the first electrode covering the light-emitting functional layer, the exposed part of the adapter pattern and the partition gasket in a shape-following manner such that the first electrode is lapped onto the adapter pattern.

In a possible embodiment of the present disclosure, the forming the partition gasket on the side surface of the planarization layer and the adapter pattern away from the back plate specifically includes: forming a negative photoresist layer on the side surface of the planarization layer and the adapter pattern away from the back plate; and exposing and developing the negative photoresist layer to obtain the partition gasket.

In a possible embodiment of the present disclosure, the forming the light-emitting element and the partition structure on the back plate specifically includes: undercutting the first signal line so that the first signal line is provided with a lateral groove at a position corresponding to the second film layer; forming the planarization layer on a side of the first signal line away from the base substrate of the back plate, and patterning the planarization layer to form an opening pattern; forming the light-emitting functional layer, the light-emitting functional layer being interrupted by the first signal line with the lateral groove to form the opening so that the first signal line is exposed; and forming the first electrode, the first electrode covering the first signal line in a shape-following manner so as to be directly lapped onto the first signal line.

The present disclosure has the following beneficial effects.

According to the embodiments of the preset disclosure, the display substrate includes the first screen and the second screen, and the outer contour of the first screen cooperates with the outer contour of the second screen to define at least one recess, i.e., the display substrate is a special-shaped display substrate having an recess. The first signal line for providing the common power supply voltage signal extends along the peripheral region of the first screen and the second screen, and the partition structure is provided along the edge of the recess in the peripheral region of the first screen and the second screen, so as to interrupt the light-emitting functional layer of the light-emitting element to form the opening. The first electrode covers the partition structure in a shape-following manner due to its excellent climbing performance, and then is lapped onto the first signal line through the opening, i.e., it is able for the first electrode of the special-shaped display substrate with the recess to extend along the edge of the recess to be lapped onto the first signal line. As compared with the related art where it is impossible for a cathode to be lapped onto a signal line VSS at the recess, in the embodiments of the present disclosure, the first electrode is lapped onto the first signal line along the edge of the recess. As a result, it is able to reduce an IR drop of a common power supply voltage, and reduce a brightness difference between the first screen and the second screen as well as a brightness difference in a same screen, thereby to improve the brightness uniformity.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number of importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The following description will be given at first.

In the related art, there exists such a problem that non-uniform display brightness occurs for some full-screen or double-screen display devices.

Figure 1:
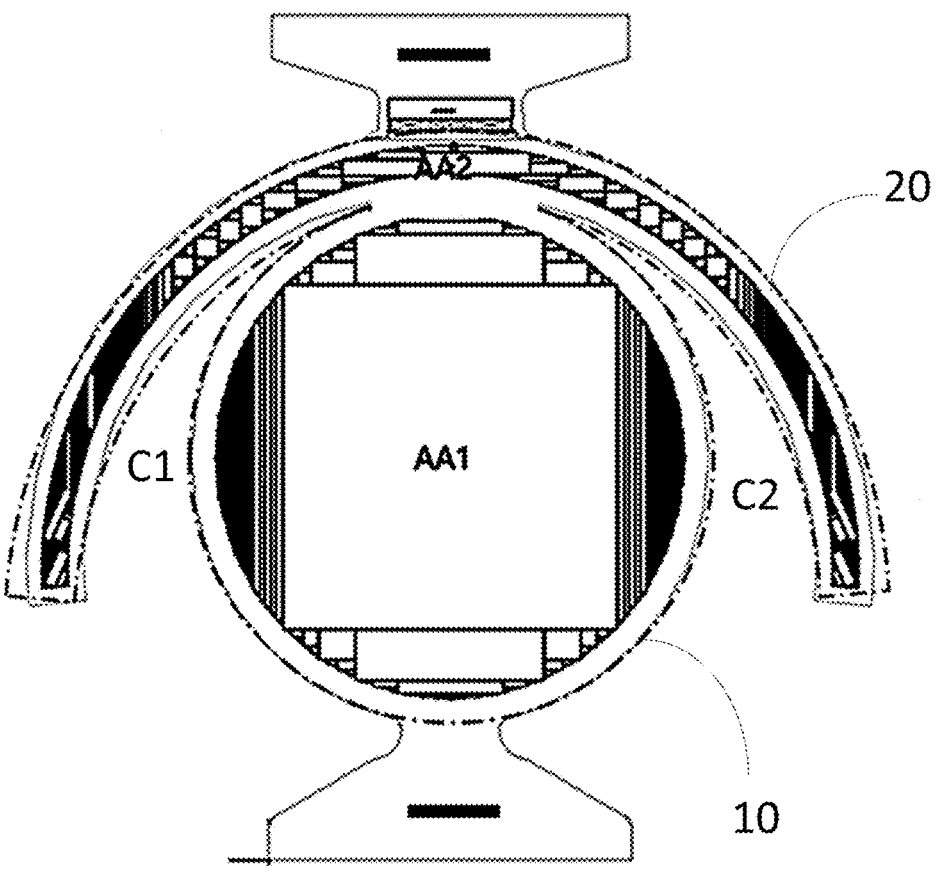
FIG. 1 is a schematic view of a display substrate including a circular primary screen and a ring-like secondary screen.
Figure 2:
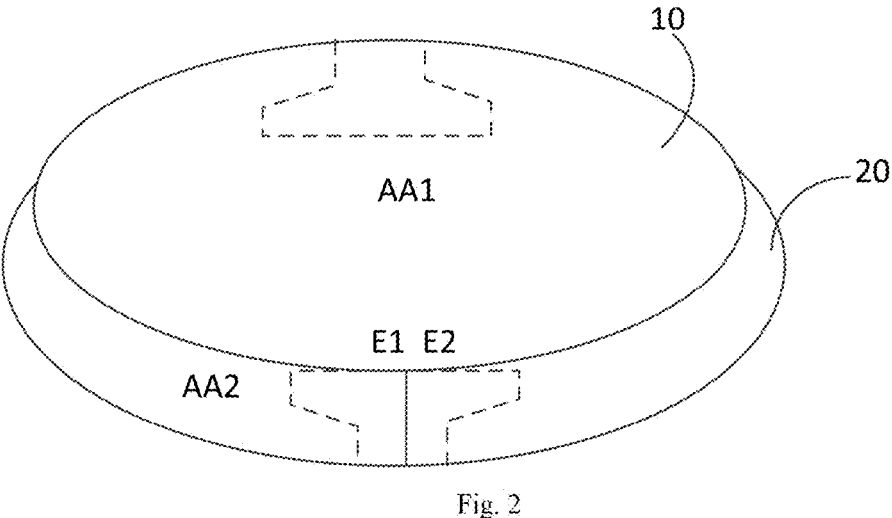
FIG. 2 is another schematic view of the display device including the circular primary screen and the ring-like secondary screen.

It is found through researches that, taking a circular display device as an example, as shown in FIG. 1, back plates of a primary screen 10 and a secondary screen 20 in the display substrate of the circular display device are formed as one piece, and the circular primary screen 10 and the ring-shaped secondary screen 20 are combined to form a concave-polygonal display substrate having recesses, i.e., C1 and C2 in FIG. 1. As shown in FIG. 2, when the display substrate is applied to a circular display device, the secondary screen 20 surrounds the primary screen 10, and both a display region AA1 of the primary screen 10 and a display region AA2 of the secondary screen 20 are used for display.

For the concave-polygonal display substrate, due to the presence of the recesses, when a light-emitting functional layer is formed through evaporation, a mask needs to be provided with openings at positions corresponding to the recesses. Hence, when stretching the mask, it is impossible to support the mask at the openings corresponding to the recesses.

When the light-emitting functional layer of each of the primary screen 10 and the secondary screen 20 is formed through a respective mask, it is also impossible to support the mask at the opening due to the shape of the secondary screen 20. In addition, the primary screen 10 is in contact with the secondary screen 20 at a very tiny place, so evaporation shadows may influence each other.

Figure 3:
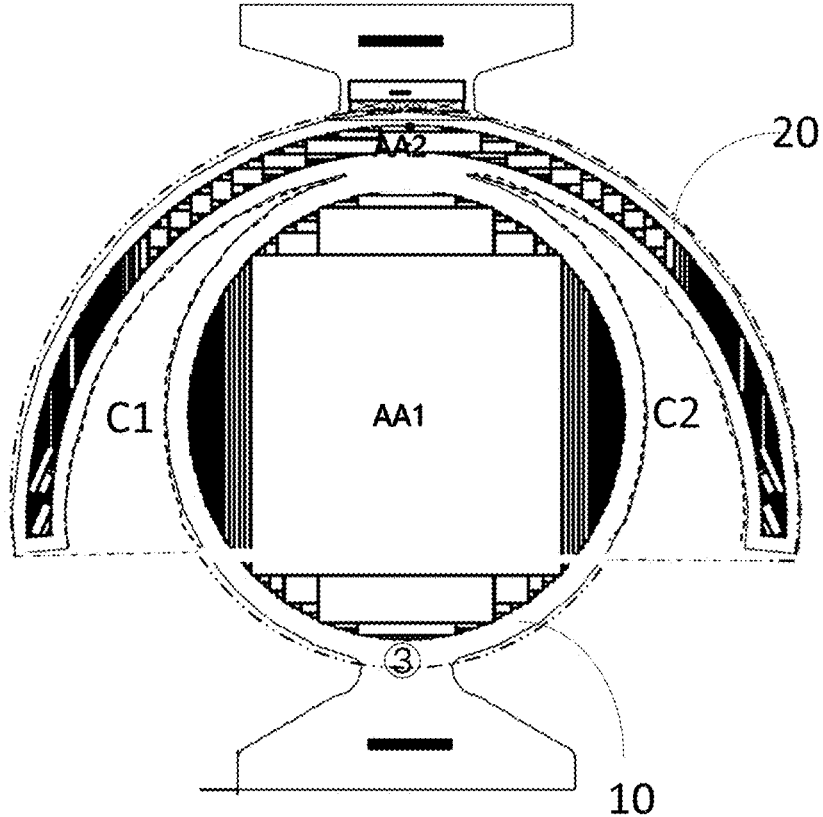
FIG. 3 is a schematic view showing a convex polygonal mask when it is stretched.

It is found that, when the display substrate with recesses is supplemented to form a convex-polygonal display substrate (a counter of a convex polygon is indicated by a dotted line ③ in FIG. 3), it is able to support the mask when the mask is stretched.

However, when the display substrate is supplemented to form the convex-polygonal display substrate, in regions where the primary screen 10 is coupled to the secondary screen 20, namely, regions along the recesses C1 and C2 in FIG. 3, it is impossible to interrupt the light-emitting functional layer during the evaporation. At this time, it is impossible for a cathode to be lapped onto a signal line VSS (a common power supply voltage signal line) at the regions along the recesses.

As shown in FIG. 3, when the display substrate is supplemented to form the convex-polygonal display substrate, a normal mask design is adopted for the primary screen 10 other than the regions along recesses, and the light-emitting functional layer is indented relative to the cathode, so the cathode is normally lapped onto the signal line VSS.

However, at a periphery of each of the primary screen 10 and the secondary screen 20 corresponding to the recesses C1 and C2 in FIG. 3, during the evaporation, it is impossible to interrupt the light-emitting functional layer, so a region where the cathode is lapped onto the signal line VSS is covered by the light-emitting functional layer, and thereby it is impossible for the cathode to be lapped onto the signal line VSS. Hence, for the entire display substrate, the cathode is lapped onto the signal line VSS merely along a lower half part of the circular primary screen 10 other than the regions corresponding to the recesses C1 and C2.

As shown in FIG. 3, for the primary screen 10, it is impossible for the cathode to be lapped onto the signal line VSS at an upper half part of the display region AA1, so non-uniform VSS potential distribution occurs for the display region AA1, and thereby the brightness uniformity of the screen is seriously adversely affected.

Figure 4:
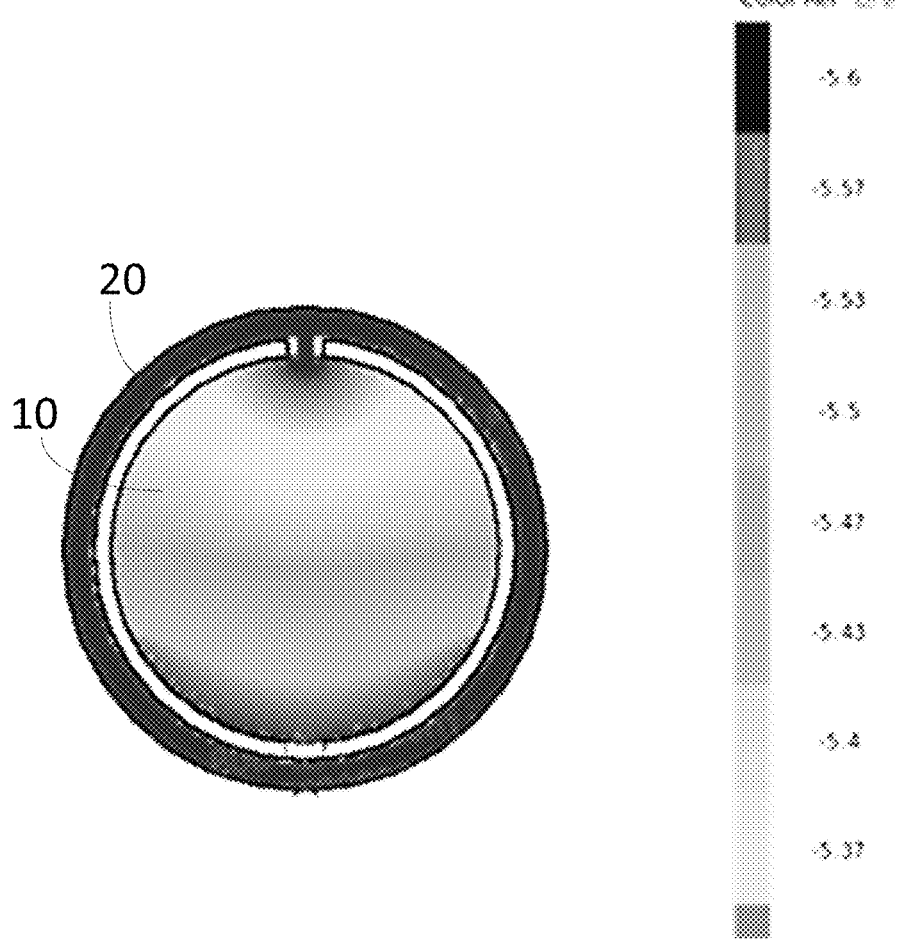
FIG. 4 is a simulation diagram of the VSS potential distribution for the primary screen and the secondary screen of the display substrate in FIG. 3.
Figure 5:
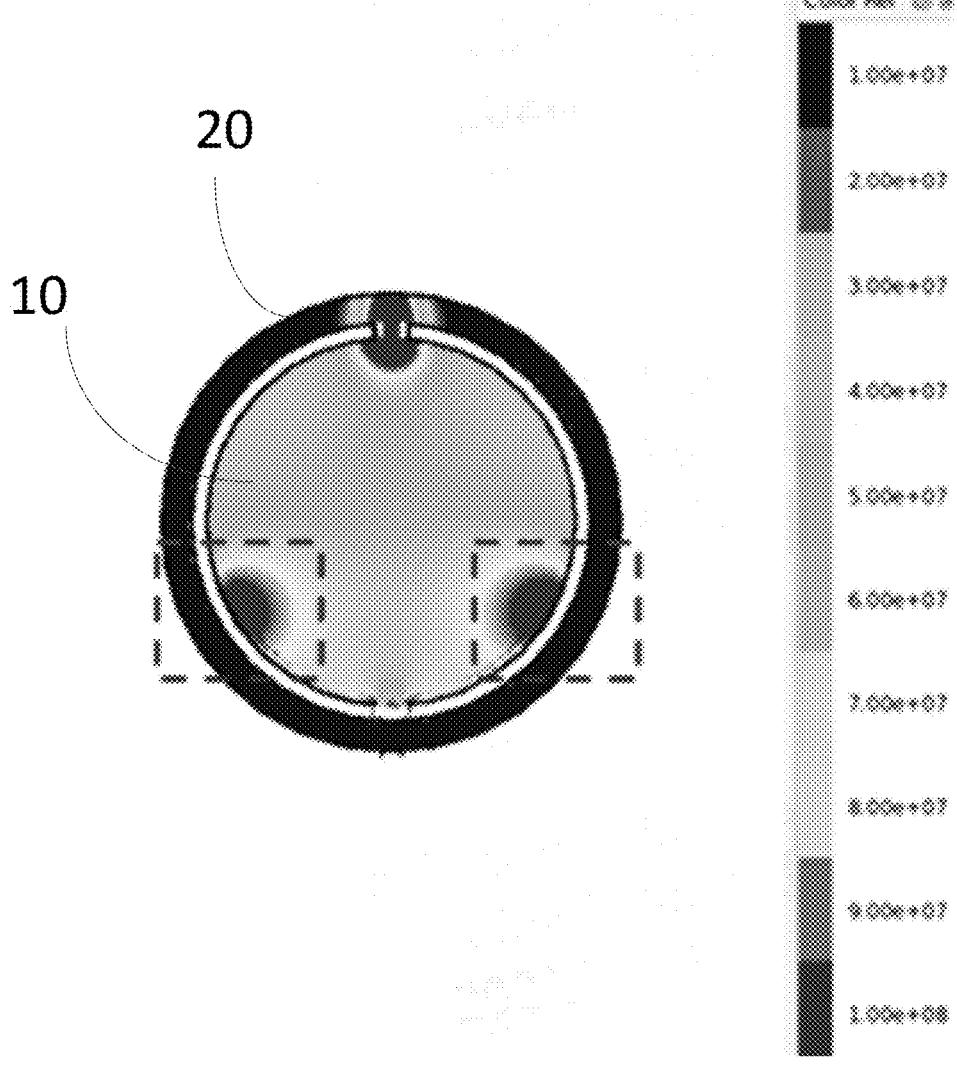
FIG. 5 is a simulation diagram of the current density distribution for the primary screen and the secondary screen of the display substrate in FIG. 3.

FIG. 4 shows a simulation result of the VSS potential distribution of the display substrate in FIG. 3. In FIG. 4, different grayscales represent different voltages. As shown in FIG. 4, an obvious IR drop occurs for the primary screen 10 from bottom to top, i.e., the brightness uniformity is deteriorated. FIG. 5 shows a simulation result of the current density distribution of the display substrate. As shown in FIG. 5, the cathode is lapped onto the signal line VSS merely at the lower half of the display region AA1 of the primary screen 10, so obvious current concentration occurs for the cathode at a position where the cathode is lapped onto the signal line VSS, and thereby a temperature rise occurs. At this time, a short circuit or an open circuit occurs due to a high temperature, and a service life of a light-emitting element at the position is adversely affected.

An object of the present disclosure is to provide a display substrate, a manufacturing method thereof and a display device, so as to reduce a brightness difference between different screens as well as a brightness difference in a same screen, thereby to improve the brightness uniformity.

Figure 6:
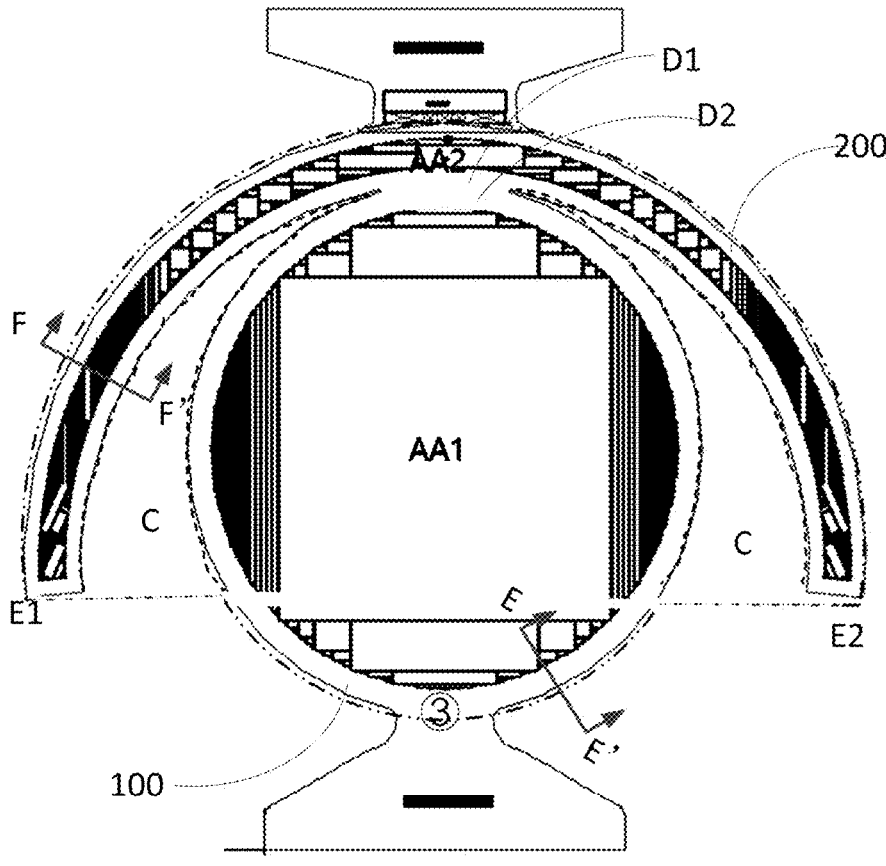
FIG. 6 a schematic view of a display substrate according to one embodiment of the present disclosure.

As shown in FIG. 6, the present disclosure provides in some embodiments a display substrate which includes a first screen 100 and a second screen 200, and an outer contour of the first screen 100 cooperates with an outer contour of the second screen 200 so as to define at least one recess C in the display substrate. In other words, the display substrate is a special-shaped display substrate at least consisting of the first screen 100 and the second screen 200 and having the recess C.

In some embodiments of the present disclosure, as shown in FIG. 6, the first screen 100 is a circular primary screen and the second screen 200 is a semi-annular secondary screen. An inner diameter of the secondary screen is greater than an inner diameter of the primary screen, a center of the secondary screen coincides with a center of the primary screen, a first inner tangent point D1 of the secondary screen is in contact with a second outer tangent point D2 of the primary screen, and the recess C is defined by an outside contour of the primary screen and an inside contour of the secondary screen.

The secondary screen is stretchable, and before the primary screen is spliced with the secondary screen, as shown in FIG. 6, the secondary screen (the second screen 200) is in a naturally contracted state and encloses the primary screen (the first screen 100) in a half-surrounded manner. After the primary screen is spliced with the secondary screen, as shown in FIG. 2, the secondary screen further includes a first end E1 and a second end E2 opposite to each other in a circumferential direction of the secondary screen. At this time, the secondary screen is in a stretched state, and the first end E1 abuts against the second end E2 so that the secondary screen surrounds the primary screen.

It should be appreciated that, back plates of the first screen 100 and the second screen 200 are formed as one piece, and the specific shapes of the first screen 100 and the second screen 200 will not be particularly defined herein.

Figure 7:
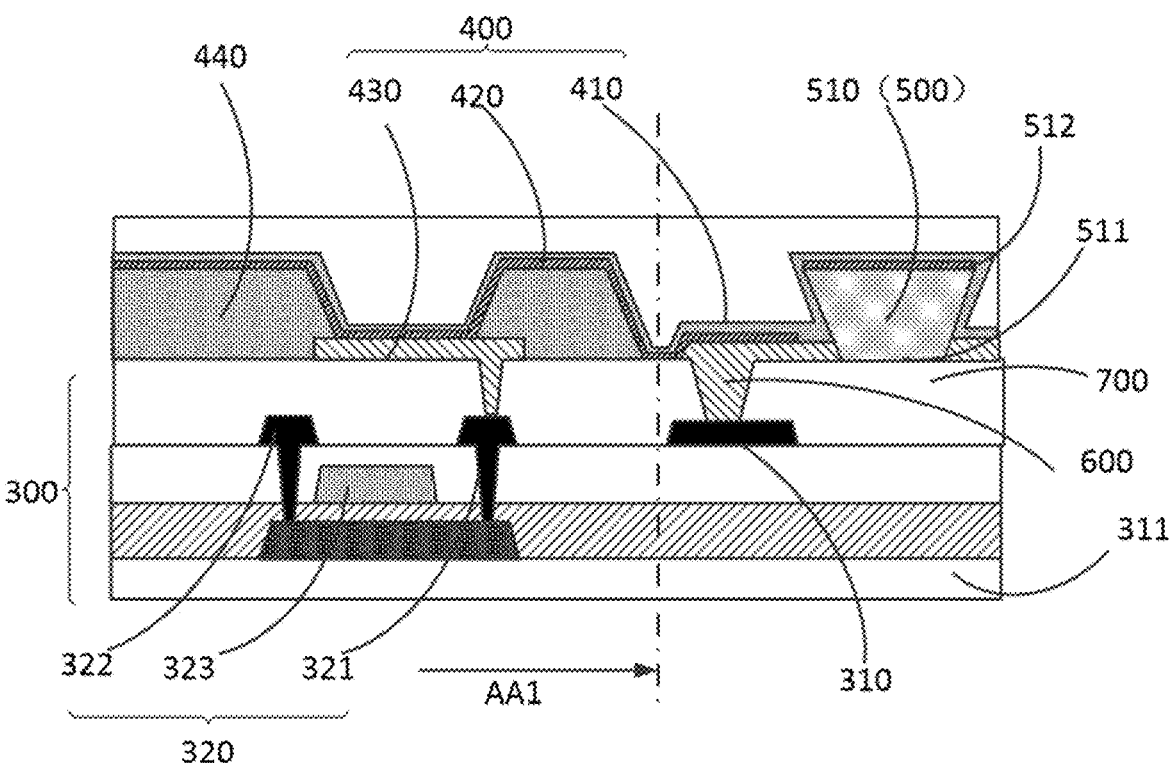
FIG. 7 is a sectional view of the display substrate along line F-F' in FIG. 6.

As shown in FIG. 7, the display substrate includes a back plate 300 and light-emitting elements 400. The back plate 300 includes a first signal line 310 (namely, a signal line VSS) for providing a common power supply voltage signal, and the first signal line 310 is arranged in a peripheral region of the first screen 100 and the second screen 200. The light-emitting elements 400 are arranged in the first screen 100 and the second screen 200, and the light-emitting element 400 includes a first electrode 410, a light-emitting functional layer 420 and a second electrode 430 laminated one on another from a side away from the back plate 300 to a side close to the back plate 300. A partition structure 500 is provided along an edge of the recess C in the peripheral regions of the first screen 100 and the second screen 200, and arranged at a side of the light-emitting functional layer 420 close to the back plate 300. An orthogonal projection of the light-emitting functional layer 420 onto the back plate 300 and an orthogonal projection of the first electrode 410 onto the back plate 300 at least partially overlap with an orthogonal projection of the partition structure 500 onto the back plate 300. The light-emitting functional layer 420 is interrupted by the partition structure 500 to form an opening. The first electrode 410 covers the partition structure 500 in a shape-following manner and is lapped onto the first signal line 310 via the opening.

According to the embodiments of the present disclosure, the display substrate includes the first screen 100 and the second screen 200, and the outer contour of the first screen 100 cooperates with the outer contour of the second screen 200 to define the recess C, i.e., the display substrate is a special-shaped display substrate having the recess C. The first signal line 310 for providing the common power supply voltage signal extends along the peripheral regions of the first screen 100 and the second screen 200, and the partition structure 500 is provided along the edge of the recess in the peripheral regions of the first screen 100 and the second screen 200, so as to interrupt the light-emitting functional layer 420 of the light-emitting element 400 to form the opening. The first electrode 410 covers the partition structure in a shape-following manner due to its excellent climbing performance, and then is lapped onto the first signal line 310 through the opening, i.e., it is able for the first electrode 410 of the special-shaped display substrate with the recess C to extend along the edge of the recess C to be lapped onto the first signal line 310. As compared with the related art where it is impossible for a cathode to be lapped onto a signal line VSS at the recess C, in the embodiments of the present disclosure, the first electrode 410 is lapped onto the first signal line 310 along the edge of the recess C. As a result, it is able to reduce an IR drop of a VSS voltage, and reduce a brightness difference between the first screen 100 and the second screen 200 as well as a brightness difference in a same screen, thereby to improve the brightness uniformity.

In some embodiments of the present disclosure, one second electrode 430 corresponds to at least one pixel, and the first electrode 410 corresponds to at least one second electrode 430. For example, the second electrodes 430 correspond to the pixels respectively, the first electrode 410 is a surface-like electrode, and an orthogonal projection of a pattern of the first electrode 410 onto a base substrate 311 of the back plate 300 coincides with orthogonal projections of the first screen 100 and the second screen 200 onto the base substrate 311.

Illustratively, the light-emitting element 400 is an OLED, the first electrode 410 is a cathode, the second electrode 430 is an anode, and the light-emitting functional layer 420 includes an organic electroluminescent layer, a hole transport layer, an electron transport layer, etc.

Figure 14:
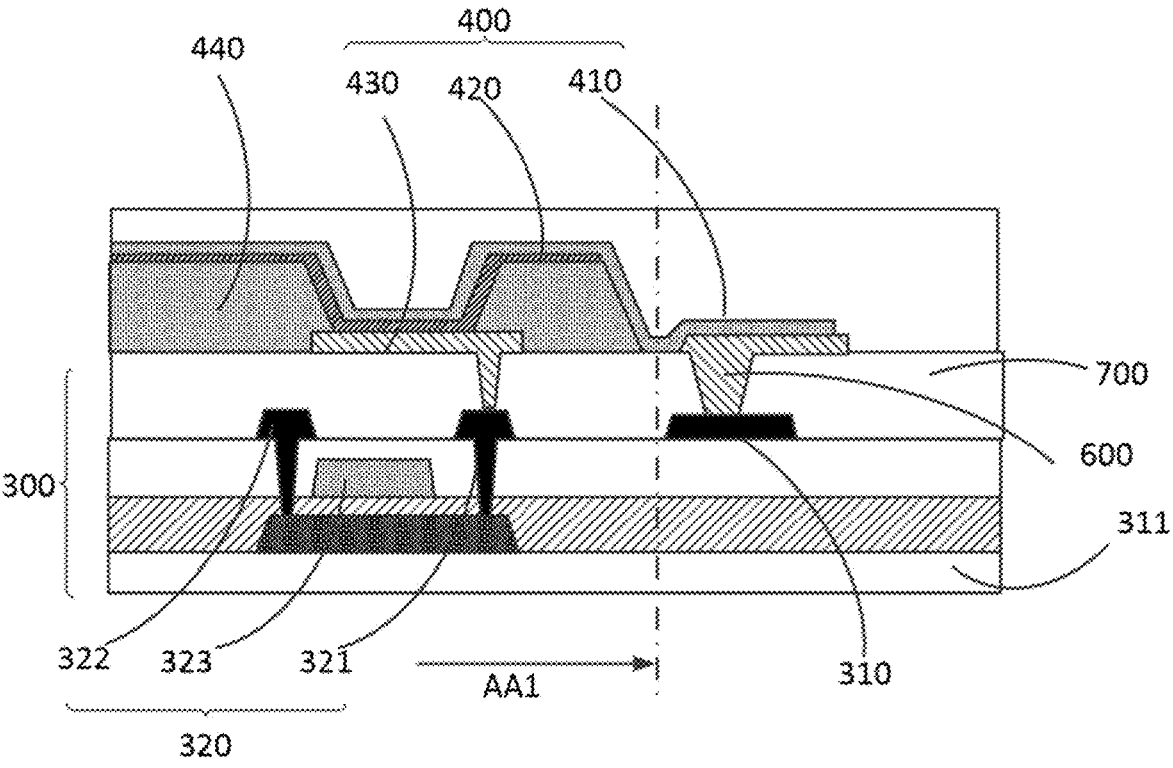
FIG. 14 is a sectional view of the display substrate along line E-E' in FIG. 6.

In some embodiments of the present disclosure, as shown in FIG. 14, in the peripheral region of the first screen 100 and the second screen 200 other than a region corresponding to the recess C, the orthogonal projection of the light-emitting functional layer 420 onto the back plate 300 does not coincide with an orthogonal projection of the first signal line 310 onto the back plate 300, the orthogonal projection of the first electrode 410 onto the back plate 300 coincides with the orthogonal projection of the first signal line 310 onto the back plate 300, and the first electrode 410 is lapped onto the first signal line 310.

Based on the above, the partition structure 500 is arranged merely in the first screen 100 and the second screen 200 at a position corresponding to the recess C, so as to enable the first electrode 410 to be lapped onto the first signal line 310. In a region other than the region corresponding to the recess C, the first electrode 410 is lapped onto the first signal line 310 in a conventional manner, namely, the light-emitting functional layer 420 is indented relative to the first electrode 410, so that the first electrode 410 is lapped onto the first signal line 310.

It should be appreciated that, the partition structure 500 may also be arranged in the peripheral regions of the first screen 100 and the second screen 200 other than a region corresponding to the recess C, so as to interrupt the light-emitting functional layer 420, thereby to enable the first electrode 410 to be lapped onto the first signal line 310.

Further, in some embodiments of the present disclosure, the first electrode 410 is lapped onto the first signal line 310 through an adapter pattern 600.

Based on the above, as shown in FIG. 7, an insulating layer such as a planarization layer 700 is arranged between the first signal line 310 and the first electrode 410, so the first signal line 310 needs to be lapped onto the first electrode 410 through a via hole in the insulating layer. In order to ensure that the first signal line 310 is lapped onto the first electrode 410 effectively, the adapter pattern 600 is provided. An orthogonal projection of the adapter pattern 600 onto the base substrate 311 of the back plate 300 at least partially overlaps with the via hole and the first electrode 410, and a width of the adapter pattern 600 in a direction perpendicular to the base substrate 311 is greater than a width of the via hole, so as to enable the first electrode 410 to be lapped onto the adapter pattern 600, thereby to be lapped onto the first signal line 310 through the via hole and the adapter pattern 600.

Illustratively, the adapter pattern 600 is arranged at a same layer, and made of a same material, as the first electrode 410.

Based on the above, the first electrode 410 and the adapter pattern 600 are formed through a same patterning process, so as to simplify the manufacture thereof. Of course, it should be appreciated that, the adapter pattern 600 may be arranged at a layer or made of a material different from the first electrode 410.

It should be appreciated that, in some other embodiments of the present disclosure, the first electrode 410 may also be directly lapped onto the first signal line 310.

The second electrode 430, the light-emitting functional layer 420 and the first electrode 410 are laminated one on another on the back plate 300 from bottom to top, and the partition structure 500 functions as to interrupt the light-emitting functional layer 420. The first electrode 410 is maintained continuous and lapped onto the first signal line 310 via the opening in the light-emitting functional layer 420. The partition structure 500 may be provided in various ways, which will be described hereinafter.

In some embodiments of the present disclosure, as shown in FIG. 7, the display substrate further includes a planarization layer 700 arranged between the first signal line 310 and the light-emitting element 400. The partition structure 500 includes a partition gasket 510 extending along an edge of the recess C and arranged on a side surface of the planarization layer 700 away from the back plate 300. A cross section of the partition gasket 510 in a direction perpendicular to the back plate 300 is an inverted trapezoid with a long upper base 512 and a short lower base 511, the lower base 511 is arranged close to the back plate 300, and the upper base 512 is arranged away from the back plate 300. An orthogonal projection of the adapter pattern onto the back plate 300 at least partially overlaps with the orthogonal projection of the first signal line 310 onto the back plate 300, and the adapter pattern is lapped onto the first signal line 310 through a via hole in the planarization layer 700. An orthogonal projection of the partition gasket 510 onto the back plate 300 partially overlaps with the orthogonal projection portion of the adapter pattern onto the back plate 300, the light-emitting functional layer 420 covers a side of the adapter pattern and the partition gasket 510 away from the back plate 300, and a segment difference is provided between the partition gasket 510 and the adapter pattern in the direction perpendicular to the back plate 300, so that the light-emitting functional layer 420 is interrupted to form the opening and a part of the adapter pattern is exposed. The first electrode 410 covers the light-emitting functional layer 420, the exposed part of the adapter pattern and the partition gasket 510 in a shape-following manner so that the first electrode 410 is lapped onto the adapter pattern.

Figure 8:
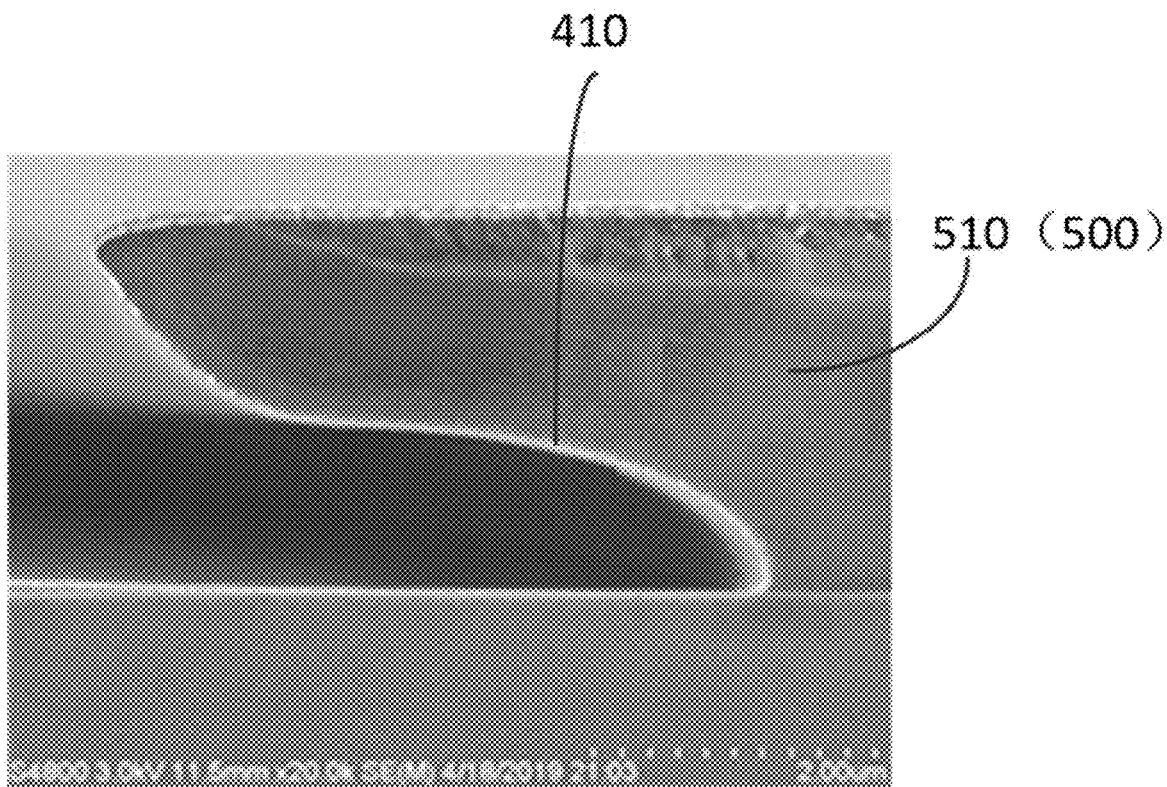
FIG. 8 is a topical electron micrograph of the display substrate at a partition structure in FIG. 7.

Based on the above, the inverted trapezoid-like partition gasket 510 is arranged along the edge of the recess C. Specifically, as shown in FIG. 7, the display substrate further includes a pixel definition layer with apertures, and the partition gasket 510 is arranged along the edge of the recess C at a position corresponding to the aperture at a periphery of the pixel definition layer. The partition gasket 510 is of an inverted trapezoid shape, so the light-emitting functional layer 420 is interrupted by an upper edge (i.e., an edge of the upper base) of the partition gasket 510 so as to form the opening, thereby to expose a part of the adapter pattern 600. However, the first electrode 410 has excellent climbing performance and wrapping performance, so the first electrode 410, without being interrupted, is lapped onto the adapter pattern 600 on the upper edge of the partition gasket 510 at a position where the second electrode 430 is exposed. FIG. 8 is an actual electron micrograph showing a situation where the light-emitting functional layer is interrupted by the partition gasket but the first electrode is not interrupted.

In the embodiments of the present disclosure, for example, the partition gasket 510 is made of a negative photoresist, and it is patterned through an exposure and development process. Of course, it should be appreciated that, the specific structure of the partition gasket 510 is not limited to the inverted trapezoid-like structure, and a material thereof is not limited to the negative photoresist.

Figure 9:
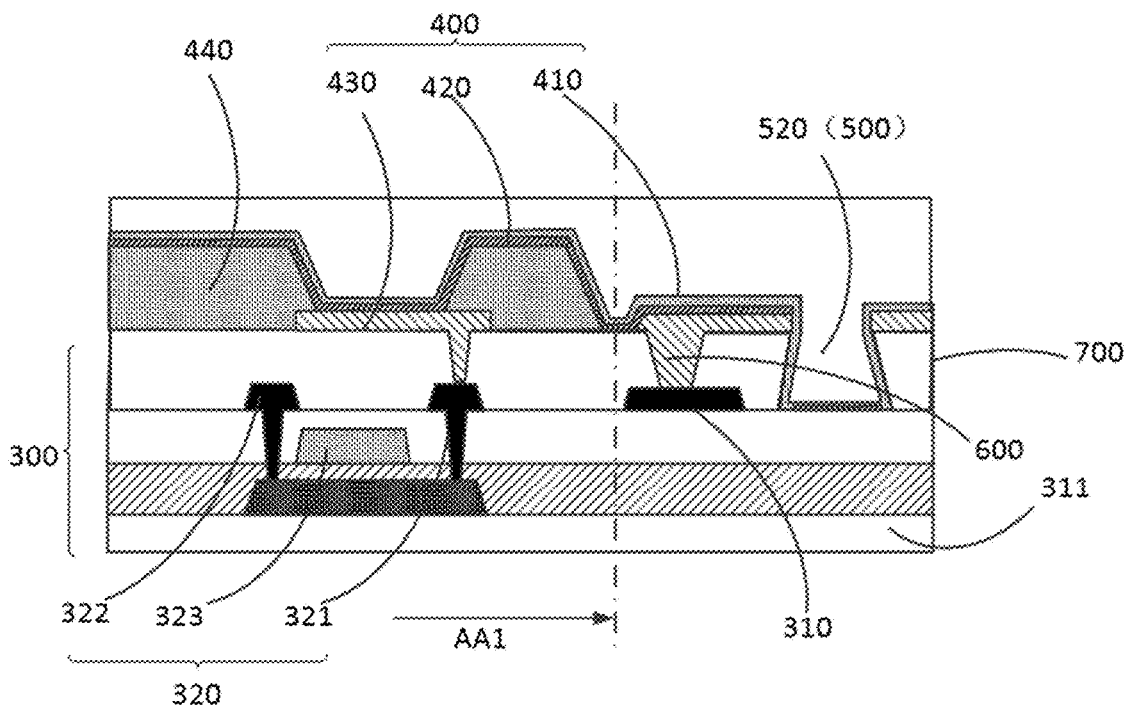
FIG. 9 is another sectional view of the display substrate along line F-F' in FIG. 6.

In another possible embodiment of the present disclosure, as shown in FIG. 9, the partition structure 500 includes a groove 520 located on a side surface of the planarization layer 700 away from the back plate 300 and extending along the edge of the recess C, an orthogonal projection of the groove 520 in a direction perpendicular to the back plate 300 at least partially overlaps with the orthogonal projection of the adapter pattern onto the back plate 300, the orthogonal projection of the adapter pattern onto the back plate 300 at least partially overlaps with the orthogonal projection of the first signal line 310 onto the back plate 300, and the adapter pattern is lapped onto the first signal line 310 through a via hole in the planarization layer 700. The orthogonal projection of the groove 520 onto the back plate 300 partially overlaps with the orthogonal projection portion of the adapter pattern onto the back plate 300, the light-emitting functional layer 420 covers a side of the adapter pattern 600 away from the back plate 300 and a bottom of the groove 520 close to the back plate 300, and a segment difference is provided between the groove 520 and the adapter pattern 600 in the direction perpendicular to the back plate 300, so that the light-emitting functional layer 420 is interrupted to form the opening and a part of the adapter pattern is exposed; The first electrode 410 covers the light-emitting functional layer 420, the exposed part of the adapter pattern 600, and the groove 520 in a shape-following manner such that the first electrode 410 is lapped onto the adapter pattern 600.

Based on the above, the trapezoidal groove 520 is arranged along the edge of the recess C. Specifically, as shown in FIG. 9, the display substrate further includes a pixel definition layer 440 with apertures, the partition gasket 510 is arranged along the edge of the recess C at a position corresponding to the aperture at a periphery of the pixel definition layer 440. The orthogonal projection of the groove 520 onto the back plate 300 at least partially overlaps with the orthogonal projection of the adapter pattern onto the back plate 300, so the light-emitting functional layer 420 is interrupted by the upper edge of the groove 520 to form the opening, and a part of the adapter pattern 600 is exposed through the opening. However, the first electrode 410 has excellent climbing performance and wrapping performance, so the first electrode 410, without being interrupted, is lapped onto the adapter pattern 600 on the upper edge of the groove 520 at a position where the first electrode 410 is exposed.

Illustratively, as shown in FIG. 9, a cross section of the groove 520 has a trapezoidal shape with a short upper base and a long lower base, the lower base is a side close to the back plate 300, and the upper base is a side away from back plate 300. The groove 520 is formed through patterning the planarization layer 700.

Figure 10:
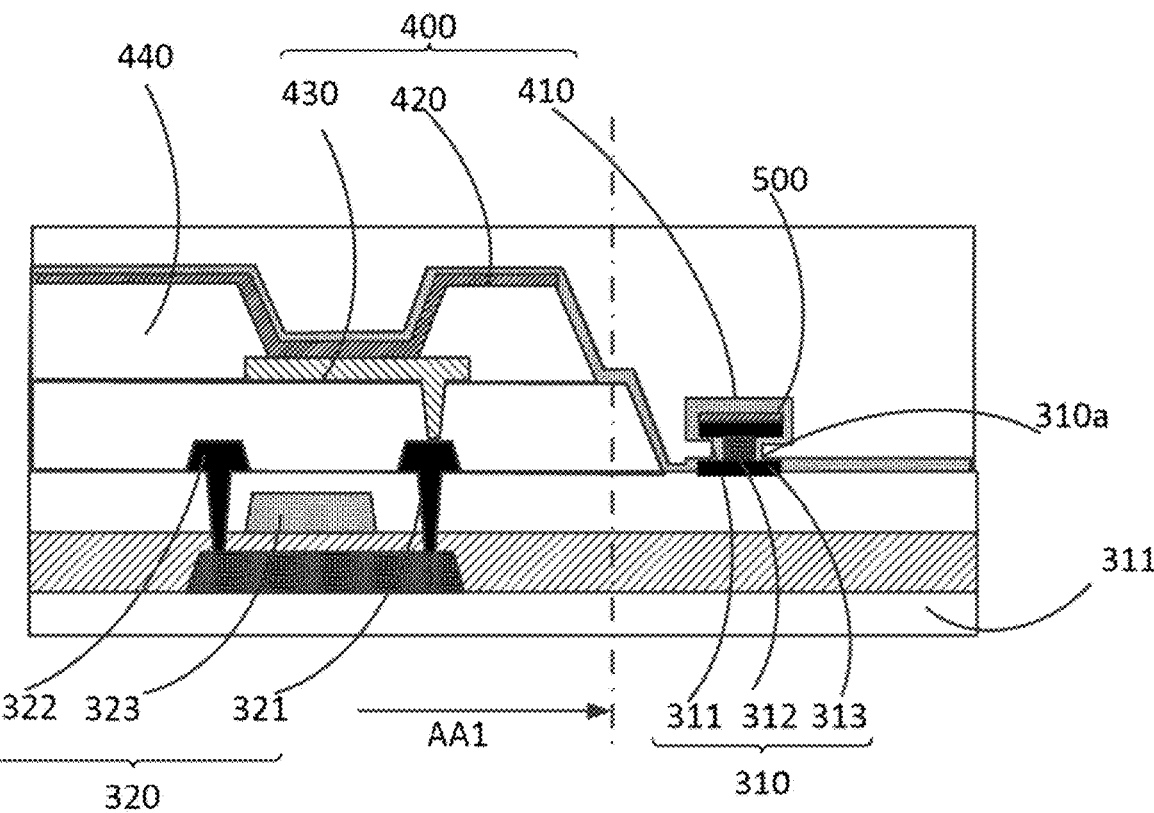
FIG. 10 is yet another sectional view of the display substrate along line F-F' in FIG. 6.

In addition, in yet another possible embodiment of the present disclosure, as shown in FIG. 10, the first signal line 310 includes a first film layer 311, a second film layer 312 and a third film layer 313 laminated one on another in a direction away from the back plate 300. A width of the second film layer 312 in a direction perpendicular to an extending direction of the first signal line 310 is less than a width of the first film layer 311 and a width of the third film layer 313 in the direction perpendicular to the extending direction of the first signal line 310, so that a lateral groove 310a is formed in a side surface of the first signal line 310 at a position corresponding to the second film layer 312, and the first signal line 310 having the lateral groove 310a forms the partition structure 500. The planarization layer 700 has an opening pattern, and an orthogonal projection of the opening pattern onto the back plate 300 coincides with an orthogonal projection of the first signal line 310 having the lateral groove 310a onto the back plate 300. The light-emitting functional layer 420 is interrupted by the first signal line 310 having the lateral groove 310a so as to form the opening, thereby to expose the first signal line 310. The first electrode 410 covers the first signal line 310 in a shape-following manner, so as to be directly lapped onto the first signal line 310.

Based on the above, the first signal line 310 is of a sandwich-like structure. The first signal line 310 is exposed through the opening pattern of the planarization layer 700, so when the first electrode 410 is etched, the second film layer 312 in the middle is laterally etched inward so as to form an I-shaped undercut structure, namely the lateral groove 310a.

As shown in FIG. 10, in a subsequent step of forming the light-emitting element 400, the opening pattern is reserved. When forming the light-emitting functional layer 420 through evaporation, the light-emitting functional layer 420 is interrupted by the lateral groove 310a. The first electrode 410 has excellent climbing performance, so it covers the I-shaped first signal line 310, so as to be directly lapped onto the first signal line 310.

In addition, the first electrode 410 is in contact with the first film layer 311 and the side second film layer 312 of the first signal line 310 at the same time, so as to increase a contact area between the first electrode 410 and the first signal line 310 and reduce a contact resistance, thereby to reduce the IR drop.

As shown in FIG. 10, for example, the back plate 300 includes a thin film transistor 320, which includes a source electrode 321, a drain electrode 322 and a gate electrode 323. The first signal line 310 is arranged at a same layer, and made of a same material, as the source electrode 321 and the drain electrode 322. For example, the source electrode and the drain electrode are of a sandwich-like structure, e.g., Ti/Al/Ti.

Figure 11:
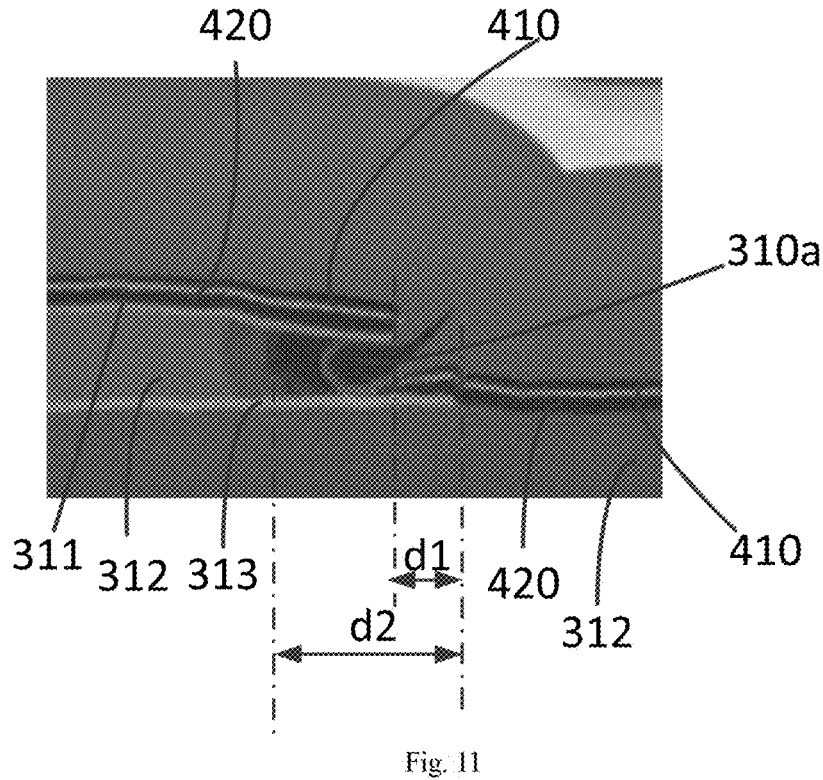
FIG. 11 is a topical electron micrograph of the display substrate at a partition structure in FIG. 10.

FIG. 11 shows an actual simulation result of the partition structure according to one embodiment of the present disclosure. Referring to FIG. 11, in some embodiments of the present disclosure, the width of the first film layer 311 in the direction perpendicular to the extending direction of the first signal line 310 is less than the width of the third film layer 313 in the direction perpendicular to the extending direction of the first signal line 310. As shown in FIG. 11, a difference between the width of the first film layer 311 and the width of the third film layer 313 is about 2d1. For example, d1=370 nm. A difference between the width of the second film layer 312 and the width of the third film layer 313 is about 2d2. For example, d2=1010 μm. Of course, it should be appreciated that, the widths of the first film layer 311, the second film layer 312 and the third film layer 313 will not be particularly defined herein.

Figure 12:
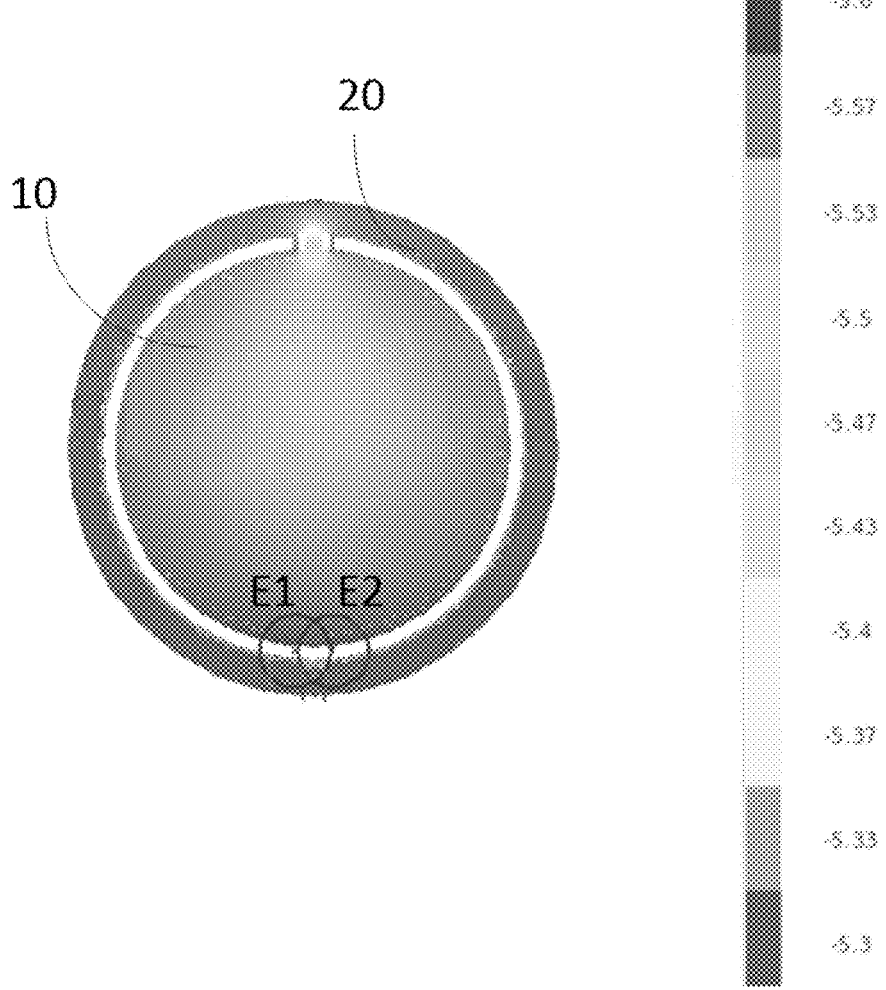
FIG. 12 is a simulation diagram of the VSS potential distribution for a primary screen and a secondary screen of the display substrate according to one embodiment of the present disclosure.

FIG. 12 shows a simulation result of the VSS potential distribution of the display substrate. As shown in FIG. 12, the first electrode 410 is lapped onto the first signal line 310 at the entire periphery of the first screen 100, so the common power supply voltage is uniformly distributed over the entire first screen 100. In this way, it is able to greatly improve the launch range uniformity (LRU) from 60% to 90%.

Figure 13:
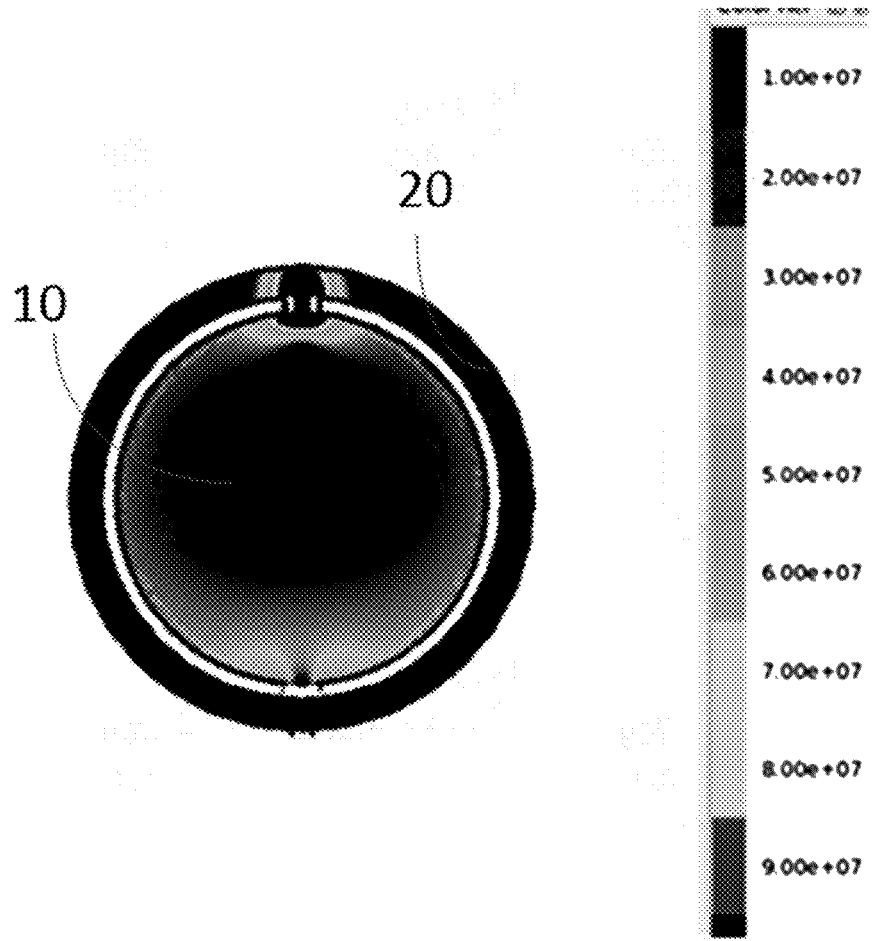
FIG. 13 is a simulation diagram of the current density distribution for the primary screen and the secondary screen of the display substrate according to one embodiment of the present disclosure.

FIG. 13 shows the current density distribution of the display. As shown in FIG. 13, a current of the first electrode 410 flows from the periphery of the display substrate to the first signal line 310 on the back plate 300. In this way, it is able to prevent the topical current concentration, thereby to reduce the risk of being burned due to a temperature rise.

The present disclosure further provides in some embodiments a display device which includes the above-mentioned display substrate. Obviously, the display device also has the advantageous effects of the display substrate, which will not be particularly defined herein.

In addition, as shown in FIG. 2, the secondary screen further includes a first end E1 and a second end E2 opposite to each other in a circumferential direction of semi-annular secondary screen. When the secondary screen is in a stretched state, the first end E1 abuts against the second end E2 so that the secondary screen surrounds the primary screen.

It should be appreciated that, the above description is given when the first screen 100 is a circular primary screen and the second screen 200 is a semi-annular secondary screen. In actual use, the first screen 100 is not limited to the circular primary screen, and the second screen 200 is not limited to the semi-annular secondary screen.

The present disclosure further provides in some embodiments a method for manufacturing the above-mentioned display substrate, which includes: Step S01 of forming the back plate 300, the back plate 300 including the first signal line 310 for providing a common power supply voltage signal, the first signal line 310 being arranged in a peripheral region of the first screen 100 and the second screen 200; and Step S02 of forming the light-emitting elements 400 and the partition structure 500 on the back plate 300, the light-emitting elements 400 being arranged in the first screen 100 and the second screen 200. The light-emitting element 400 includes a first electrode 410, a light-emitting functional layer 420 and a second electrode 430 laminated one on another from a side away from the back plate 300 to a side close to the back plate 300. The partition structure 500 is arranged along an edge of the recess C in the peripheral regions of the first screen 100 and the second screen 200 and at a side of the light-emitting functional layer 420 close to the back plate 300. Orthogonal projections of the light-emitting functional layer 420 and the first electrode 410 onto the back plate 300 at least partially overlap with an orthogonal projection of the partition structure 500 onto the back plate 300. The light-emitting functional layer 420 is interrupted by the partition structure 500 to form an opening. The first electrode 410 covers the partition structure 500 in a shape-following manner, and is lapped onto the first signal line 310 via the opening.

Illustratively, when the display substrate is a display substrate in FIG. 7, Step S02 specifically includes: Step S021 of forming the planarization layer 700 on a side of the first signal line 310 away from the base substrate of the back plate 300, and patterning the planarization layer 700 to form the via hole; Step S022 of forming the adapter pattern and the second electrode 430 on the planarization layer 700, an orthogonal projection of the adapter pattern onto the back plate 300 at least partially overlapping with the orthogonal projection of the first signal line 310 onto the back plate 300, the adapter pattern being lapped onto the first signal line 310 through a via hole in the planarization layer 700; Step S023 of forming the partition gasket 510 on a side surface of the planarization layer 700 and a side of the adapter pattern away from the back plate 300, an orthogonal projection of the partition gasket 510 onto the back plate 300 partially overlapping with the orthogonal projection portion of the adapter pattern onto the back plate 300, and a segment difference being provided between the partition gasket 510 and the adapter pattern in a direction perpendicular to the back plate 300; Step S024 of forming the light-emitting functional layer 420 on a side of the planarization layer 700 and a side of the partition gasket 510 away from the back plate 300, the light-emitting functional layer 420 being interrupted between the partition gasket 510 and the adapter pattern to form the opening, so that a part of the adapter pattern is exposed; and Step S025 of forming the first electrode 410 on the light-emitting functional layer 420, the first electrode 410 covering the light-emitting functional layer 420, the exposed part of the adapter pattern and the partition gasket 510 in a shape-following manner so that the first electrode 410 is lapped onto the adapter pattern.

Illustratively, Step S023 specifically includes: forming a negative photoresist layer on the side surface of the planarization layer 700 and the side surface of the adapter pattern away from the back plate 300; and exposing and developing the negative photoresist layer to form the partition gasket 510.

Illustratively, when the display substrate is a display substrate in FIG. 10, Step S02 specifically includes: Step S021 of undercutting the first signal line 310 so as to form the lateral groove 310a in a side surface of the first signal line 310 at a position corresponding to the second film layer 312; Step S022 of forming the planarization layer 700 on a side of the first signal line 310 away from the base substrate of the back plate 300, and patterning the planarization layer 700 to form the opening pattern; Step S023 of forming the light-emitting functional layer 420, the light-emitting functional layer 420 being interrupted by the first signal line 310 having the lateral groove 310a to form the opening so that the first signal line 310 is exposed; and Step S024 of forming the first electrode 410, the first electrode 410 covering the first signal line 310 in a shape-following manner so as to be directly lapped onto the first signal line 310.

It should be appreciated that, in Step S01, the back plate 300 includes the base substrate 311, a driving circuitry on the base substrate 311, and the like. The driving circuitry includes the first signal line 310. In this step, the pattern of the back plate 300 is a pattern before the formation of the recess C, i.e., an outline indicated by a dotted line in the drawings. After the light-emitting element 400 and the partition structure 500 are formed on the back plate 300, the recess C is formed through cutting. Some description will be given as follows.

(1) The drawings merely relate to structures involved in the embodiments of the present disclosure, and the other structures may refer to those known in the art.

(2) For clarification, in the drawings for describing the embodiments of the present disclosure, a thickness of a layer or region is zoomed out or in, i.e., these drawings are not provided in accordance with an actual scale. It should be appreciated that, in the case that such an element as layer, film, region or substrate is arranged "on" or "under" another element, it may be directly arranged "on" or "under" the other element, or an intermediate element may be arranged therebetween.

(3) In the case of no conflict, the embodiments of the present disclosure and the features therein may be combined to acquire new embodiments.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising a first screen and a second screen, an outer contour of the first screen cooperating with an outer contour of the second screen to define at least one recess in the display substrate, wherein the display substrate comprises:

a back plate comprising a first signal line, the first signal line being configured to provide a common power supply voltage signal and arranged in a peripheral region of the first screen and the second screen; and light-emitting elements arranged in the first screen and the second screen, the light-emitting element comprising a first electrode, a light-emitting functional layer and a second electrode laminated one on another from a side away from the back plate to a side close to the back plate, wherein a partition structure is arranged along an edge of the recess in the peripheral region of the first screen and the second screen, the partition structure is located at a side of the light-emitting functional layer close to the back plate, orthogonal projections of the light-emitting functional layer and the first electrode onto the back plate at least partially overlap with an orthogonal projection of the partition structure onto the back plate, the light-emitting functional layer is interrupted by the partition structure to form an opening, and the first electrode covers the partition structure in a shape-following manner and is lapped onto the first signal line via the opening.

2. The display substrate according to claim 1, wherein the second electrode corresponds to at least one pixel, and the first electrode corresponds to at least one second electrode.

3. The display substrate according to claim 2, wherein the first electrode is a cathode and the second electrode is an anode.

4. The display substrate according to claim 2, wherein in the peripheral region of the first screen and the second screen other than a region corresponding to the recess, the orthogonal projection of the light-emitting functional layer onto the back plate does not coincide with an orthogonal projection of the first signal line onto the back plate, the orthogonal projection of the first electrode onto the back plate coincides with the orthogonal projection of the first signal line onto the back plate, and the first electrode is lapped onto the first signal line.

5. The display substrate according to claim 1, wherein the first electrode is lapped onto the first signal line through an adapter pattern, and the adapter pattern is arranged at a same layer, and made of a same material, as the first electrode; or the first electrode is directly lapped onto the first signal line.

6. The display substrate according to claim 5, further comprising a planarization layer arranged between the first signal line and the light-emitting element, wherein the partition structure comprises a partition gasket extending along an edge of the recess and arranged on a side surface of the planarization layer away from the back plate, a cross section of the partition gasket in a direction perpendicular to the back plate is an inverted trapezoid with a long upper base and a short lower base, the lower base is arranged close to the back plate is, and the upper base is arranged away from the back plate.

7. The display substrate according to claim 6, wherein an orthogonal projection of the adapter pattern onto the back plate at least partially overlaps with the orthogonal projection of the first signal line onto the back plate, and the adapter pattern is lapped onto the first signal line through a via hole in the planarization layer;

an orthogonal projection of the partition gasket onto the back plate partially overlaps with the orthogonal projection of the adapter pattern onto the back plate, the light-emitting functional layer covers a side of the adapter pattern and the partition gasket away from the back plate, and there is a segment difference between the partition gasket and the adapter pattern in the direction perpendicular to the back plate, so that the light-emitting functional layer is interrupted to form the opening and a part of the adapter pattern is exposed; and the first electrode covers the light-emitting functional layer, the exposed part of the adapter pattern and the partition gasket in a shape-following manner such that the first electrode is lapped onto the adapter pattern.

8. The display substrate according to claim 6, wherein the partition gasket is made of a negative photoresist.

9. The display substrate according to claim 5, further comprising a planarization layer arranged between the first signal line and the light-emitting element, wherein the partition structure comprises a groove formed in a side surface of the planarization layer away from the back plate and extending along an edge of the recess, and an orthogonal projection of the groove onto the back plate at least partially overlaps with an orthogonal projection of the adapter pattern onto the back plate.

10. The display substrate according to claim 9, wherein a cross section of the groove in the direction perpendicular to the back plate is a trapezoid with a short upper base and a long lower base, the lower base is arranged close to the back plate, and the upper base is arranged away from the back plate.

11. The display substrate according to claim 9, wherein the orthogonal projection of the adapter pattern onto the back plate at least partially overlaps with the orthogonal projection of the first signal line onto the back plate, and the adapter pattern is lapped onto the first signal line through a via hole in the planarization layer;

the orthogonal projection of the groove onto the back plate partially overlaps with the orthogonal projection of the adapter pattern onto the back plate, the light-emitting functional layer covers a side of the adapter pattern away from the back plate and a bottom of the groove close to the back plate, and there is a segment difference between the groove and the adapter pattern in the direction perpendicular to the back plate, so that the light-emitting functional layer is interrupted to form the opening and a part of the adapter pattern is exposed; and the first electrode covers the light-emitting functional layer, the exposed part of the adapter pattern and the groove in a shape-following manner such that the first electrode is lapped onto the adapter pattern.

12. The display substrate according to claim 5, wherein the first signal line comprises a first film layer, a second film layer and a third film layer stacked in sequence in a direction away from the back plate, a width of the second film layer in a direction perpendicular to an extending direction of the first signal line is less than a width of each of the first film layer and the third film layer in the direction perpendicular to the extending direction of the first signal line so that the first signal line is provided with a lateral groove at a position corresponding to the second film layer, and the first signal line with the lateral groove forms the partition structure.

13. The display substrate according to claim 12, further comprising a planarization layer arranged between the first signal line and the light-emitting element, wherein the planarization layer is provided with an opening pattern, an orthogonal projection of the opening pattern onto the back plate coincides with an orthogonal projection of the first signal line with the lateral groove onto the back plate, the light-emitting functional layer is interrupted by the first signal line with the lateral groove to form the opening so that the first signal line is exposed, and the first electrode covers the first signal line in a shape-following manner so as to be directly lapped onto the first signal line.

14. The display substrate according to claim 1, wherein the back plate comprises a thin film transistor, the thin film transistor comprises a source electrode, a drain electrode and a gate electrode, and the first signal line is arranged at a same layer, and made of a same material, as the source electrode and the drain electrode.

15. The display substrate according to claim 1, wherein the first screen is a circular primary screen, the second screen is a stretchable semi-annular secondary screen, an inner diameter of the secondary screen is greater than an inner diameter of the primary screen, a center of the secondary screen coincides with a center of the primary screen, a first inner tangent point of the secondary screen is connected to a second outer tangent point of the primary screen, and the recess is defined by an outside contour of the primary screen and an inside contour of the secondary screen.

16. A display device, comprising the display substrate according to claim 1.

17. The display device according to claim 16, wherein the first screen is a circular primary screen, the second screen is a stretchable semi-annular secondary screen, an inner diameter of the secondary screen is greater than an inner diameter of the primary screen, a center of the secondary screen coincides with a center of the primary screen, a first inner tangent point of the secondary screen is connected to a second outer tangent point of the primary screen, and the recess is defined by an outside contour of the primary screen and an inside contour of the secondary screen, wherein the secondary screen further comprises a first end and a second end opposite to each other in a circumferential direction, and when the secondary screen is in a stretched state, the first end abuts against the second end so that the secondary screen surrounds the primary screen.

18. A method for manufacturing the display substrate according to claim 1, comprising:

forming a back plate, the back plate comprising a first signal line for providing a common power supply voltage signal, the first signal line being arranged in a peripheral region of the first screen and the second screen; and forming light-emitting elements and a partition structure on the back plate, the light-emitting elements being formed in the first screen and the second screen, wherein the light-emitting element comprises a first electrode, a light-emitting functional layer and a second electrode laminated one on another from a side away from the back plate to a side close to the back plate, the partition structure is arranged along an edge of the recess in the peripheral region of the first screen and the second screen, the partition structure is located at a side of the light-emitting functional layer close to the back plate, orthogonal projections of the light-emitting functional layer and the first electrode onto the back plate at least partially overlap with an orthogonal projection of the partition structure onto the back plate, the light-emitting functional layer is interrupted by the partition structure to form an opening, and the first electrode covers the partition structure in a shape-following manner and is lapped onto the first signal line via the opening.

19. The method according to claim 18, wherein the forming the light-emitting elements and the partition structure on the back plate specifically comprises:

forming a planarization layer at a side of the first signal line away from a base substrate of the back plate, and patterning the planarization layer to form the via hole;

forming an adapter pattern and a second electrode on the planarization layer, an orthogonal projection of the adapter pattern onto the back plate at least partially overlapping with an orthogonal projection of the first signal line onto the back plate, the adapter pattern being lapped onto the first signal line through the via hole in the planarization layer;

forming a partition gasket on a side surface of the planarization layer and the adapter pattern away from the back plate, an orthogonal projection of the partition gasket onto the back plate partially overlapping with the orthogonal projection of the adapter pattern onto the back plate, a segment difference being provided between the partition gasket and the adapter pattern in a direction perpendicular to the back plate;

forming a light-emitting functional layer on a side surface of the planarization layer and the partition gasket away from the back plate, the light-emitting functional layer being interrupted between the partition gasket and the adapter pattern to form an opening so that a part of the adapter pattern is exposed; and forming the first electrode on the light-emitting functional layer, the first electrode covering the light-emitting functional layer, the exposed part of the adapter pattern and the partition gasket in a shape-following manner such that the first electrode is lapped onto the adapter pattern, wherein the forming the partition gasket on the side surface of the planarization layer and the adapter pattern away from the back plate specifically comprises:

forming a negative photoresist layer on the side surface of the planarization layer and the adapter pattern away from the back plate; and exposing and developing the negative photoresist layer to obtain the partition gasket.

20. The method according to claim 18, wherein the forming the light-emitting element and the partition structure on the back plate specifically comprises:

undercutting the first signal line so that the first signal line is provided with a lateral groove at a position corresponding to the second film layer;

forming the planarization layer on a side of the first signal line away from the base substrate of the back plate, and patterning the planarization layer to form an opening pattern;

forming the light-emitting functional layer, the light-emitting functional layer being interrupted by the first signal line with the lateral groove to form the opening so that the first signal line is exposed; and forming the first electrode, the first electrode covering the first signal line in a shape-following manner so as to be directly lapped onto the first signal line.

* * * * *